(12) United States Patent
Lin et al.

(10) Patent No.: US 10,061,965 B2
(45) Date of Patent: Aug. 28, 2018

(54) FINGERPRINT SENSING UNIT AND FINGERPRINT SENSING MODULE

(71) Applicant: J-METRICS TECHNOLOGY Co., Ltd., Taipei (TW)

(72) Inventors: Wei-Ting Lin, Taipei (TW); Shih-Chun Kuo, Taipei (TW)

(73) Assignee: J-METRICS TECHNOLOGY CO., LTD., Taipei (TW)

( * ) Notice: Subject to any disclaimer, the term of this patent is extended or adjusted under 35 U.S.C. 154(b) by 60 days.

(21) Appl. No.: 15/156,950

(22) Filed: May 17, 2016

(65) Prior Publication Data

US 2017/0076134 A1 Mar. 16, 2017

(30) Foreign Application Priority Data

Sep. 10, 2015 (TW) .............................. 104214717 U
Nov. 19, 2015 (TW) .............................. 104218622 U

(51) Int. Cl.
| | |
|---|---|
| *G06K 9/00* | (2006.01) |
| *H01L 23/60* | (2006.01) |
| *H01L 23/31* | (2006.01) |
| *H01L 23/00* | (2006.01) |
| *H01L 25/065* | (2006.01) |

(52) U.S. Cl.
CPC ..... *G06K 9/00053* (2013.01); *G06K 9/00013* (2013.01); *H01L 23/60* (2013.01); *H01L 24/73* (2013.01); *H01L 23/3121* (2013.01); *H01L 24/13* (2013.01); *H01L 24/16* (2013.01); *H01L 24/17* (2013.01); *H01L 24/29* (2013.01); *H01L 24/32* (2013.01); *H01L 24/48* (2013.01); *H01L 25/0657* (2013.01); *H01L 2224/13082* (2013.01); *H01L 2224/16145* (2013.01); *H01L 2224/16227* (2013.01); *H01L 2224/17181* (2013.01); *H01L 2224/29011* (2013.01); *H01L 2224/32225* (2013.01); *H01L 2224/48227* (2013.01); *H01L 2224/73207* (2013.01); *H01L 2224/73215* (2013.01); *H01L 2224/73253* (2013.01); *H01L 2224/8185* (2013.01); *H01L 2224/81191* (2013.01); *H01L 2224/81193* (2013.01); *H01L 2224/83192* (2013.01); *H01L 2224/83851* (2013.01); *H01L 2924/00014* (2013.01); *H01L 2924/15158* (2013.01)

(58) Field of Classification Search
None
See application file for complete search history.

(56) References Cited

U.S. PATENT DOCUMENTS

| | | | | |
|---|---|---|---|---|
| 2011/0254108 A1* | 10/2011 | Gozzini | ............. | G06K 9/00053 257/415 |
| 2015/0146944 A1* | 5/2015 | Pi | ........................ | H04L 63/0861 382/124 |
| 2016/0162724 A1* | 6/2016 | Hsiao | ................ | G06K 9/00053 73/865.8 |

* cited by examiner

*Primary Examiner* — Michelle Mandala
(74) *Attorney, Agent, or Firm* — Andrew M. Calderon; Roberts Mlotkowski Safran Cole & Calderon, P.C.

(57) ABSTRACT

A fingerprint sensing unit includes a carrier substrate, a fingerprint sensing chip on an upper surface of the carrier substrate, a molding layer, a light-pervious cover layer on the molding layer, and an adhesive layer between the light-pervious cover layer and the molding layer. The fingerprint sensing chip is electrically connected to the carrier substrate. The molding layer covers the fingerprint sensing chip.

14 Claims, 6 Drawing Sheets

FINGERPRINT SENSING UNIT AND FINGERPRINT SENSING MODULE

CROSS-REFERENCES TO RELATED APPLICATIONS

This non-provisional application claims priority under 35 U.S.C. § 119(a) on Patent Application No. 104214717 filed in Taiwan, R.O.C. on 2015 Sep. 10 and Patent Application No. 104218622 filed in Taiwan, R.O.C. on 2015 Nov. 19, the entire contents of which are hereby incorporated by reference.

BACKGROUND

Technical Field

The instant disclosure relates to a fingerprint sensing unit and a fingerprint sensing module, in particular, relates to a fingerprint sensing unit and a fingerprint sensing module having a light-pervious cover layer.

Related Art

As the development of technology, mobile phones, personal notebooks, tablet PCs, or other electronic devices have become the essential apparatus in life. The information stored in those electronic devices, such as contact information and photos, increases rapidly. Those electronic devices are thus become personalized. Therefore, in order to avoid important information from being lost or stolen, the electronic devices respectively equipped with fingerprint identification components become popular.

Existing manufacturing process for producing an electronic device with fingerprint recognition function includes forming an opening on one side of the electronic device, disposing a fingerprint sensing chip in the opening, disposing the corresponding layout circuit, and then covering the fingerprint sensing chip with molding material. Thus, in the existing manufacturing process for producing the electronic devices with fingerprint recognition function, several complicated fabrication steps for additionally mounting the fingerprint sensing chip on the electronic devices are required.

SUMMARY

In an embodiment of the instant disclosure, a fingerprint sensing unit comprises a carrier substrate, a fingerprint sensing chip disposed on an upper surface of the carrier substrate, a molding layer, a light-pervious cover layer on the molding layer, and an adhesive layer between the light-pervious cover layer and the molding layer. The fingerprint sensing chip is electrically connected to the carrier substrate. The molding layer covers the fingerprint sensing chip.

In an embodiment of the instant disclosure, a fingerprint sensing unit comprises a carrier substrate, a fingerprint sensing chip on an upper surface of the carrier substrate, an adhesive layer on the fingerprint sensing chip, a light-pervious cover layer on the adhesive layer, and a filling layer disposed under the adhesive layer. The fingerprint sensing chip is electrically connected to the carrier substrate. The filling layer surrounds the fingerprint sensing chip and is located between the adhesive layer and the carrier substrate.

In an embodiment of the instant disclosure, a fingerprint sensing module comprises a fingerprint sensing unit and a circuit board. The fingerprint sensing unit comprises a carrier substrate having an upper surface and a lower surface opposite to the upper surface, a fingerprint sensing chip on the upper surface, a molding layer, a light-pervious cover layer on the molding layer, and an adhesive layer between the light-pervious cover layer and the molding layer. The fingerprint sensing chip is electrically connected to the carrier substrate. The molding layer covers the fingerprint sensing chip. The circuit board is disposed on the lower surface and electrically connected to the carrier substrate.

In summary, in the above mentioned embodiments of the fingerprint sensing unit of the present disclosure, the light-pervious cover layer can be disposed on the molding layer covering the fingerprint sensing chip through the adhesive layer or be disposed on the fingerprint sensing chip so as to form an individual fingerprint sensing module.

In addition, the fingerprint sensing unit according to one embodiment of the present disclosure comprises the outer conductive ring member which surrounds the molding layer and contacts the side surface of the molding layer. The outer conductive ring member comprises the attaching layer and the conductive layer which is formed by sputter deposition or evaporation deposition. The outer conductive ring member can be electrically connected to the fingerprint sensing chip through the gold finger pattern. According to different demand of products, the outer conductive ring member can further comprise the isolation layer. In another embodiment of the instant disclosure, the inner conductive ring member which is located on the light-pervious cover layer contacts a part of bump exposed through the top surface of the molding layer and is electrically connected to the fingerprint sensing chip. Thus, the design flexibility of the fingerprint sensing unit can be improved.

Furthermore, the fingerprint sensing module comprises the fingerprint sensing unit and a circuit board electrically connected to the fingerprint sensing unit. The circuit board is electrically connected to the gold finger pattern on the on the lower surface of the carrier substrate. The fingerprint sensing module can further comprise the conductive bezel. The conductive bezel surrounds the fingerprint sensing unit and contacts the isolation layer so that the signal from the fingerprint sensing chip cannot be transmitted to the conductive bezel through the side surface of the conductive layer. The conductive bezel is electrically connected to grounding pads of the circuit board so that the conductive bezel can be grounded for preventing electrostatic discharge. Compared to the prior art, the fingerprint sensing module of the present disclosure is an individual and modularized packaging module that is capable of easily mounting on the electronic devices, such as the smart phone, notebook and the like. Thus, in the manufacturing process for producing an electronic device with fingerprint recognition function, several complicated fabrication steps for additionally mounting the fingerprint sensing chip on electronic device can be omitted.

DETAILED DESCRIPTION

Figure 1:
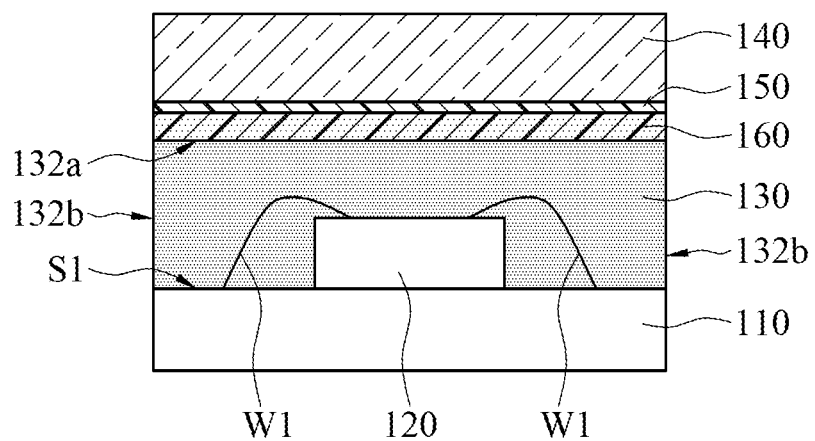
FIG. 1 is a cross-sectional view of a fingerprint sensing unit according to the first embodiment of the instant disclosure.

FIG. 1 is a cross-sectional view of a fingerprint sensing unit according to the first embodiment of the instant disclosure. Please refer to FIG. 1, the fingerprint sensing unit 100 (the fingerprint sensing unit herein is referred to as the fingerprint sensing device having a light-pervious cover layer in the parent Application No. 104214717 claimed priority on) comprises a carrier substrate 110 (the carrier substrate herein is referred to as the substrate in the parent Application), a fingerprint sensing chip 120 on the carrier substrate 110, a molding layer 130, a light-pervious cover layer 140 on the molding layer 130, and an adhesive layer 160 between the light-pervious cover layer 140 and the molding layer 130. The fingerprint sensing chip 120 is covered by the molding layer 130.

The carrier substrate 110 is used as the carrier of the fingerprint sensing chip 120. In practice, the carrier substrate 110 may be an integrated circuit carrier (IC carrier), and the layout pattern (not shown) on an upper surface S1 of the carrier substrate 110 is designed according to the requirements of electrically connections.

The fingerprint sensing chip 120 is disposed on the upper surface S1 of the carrier substrate 110 and electrically connected to the carrier substrate 110. In this embodiment, the fingerprint sensing chip 120 is electrically connected to the carrier substrate 110 through at least one bond wire W1 by wire bonding method. However, in another embodiment, the fingerprint sensing chip 120 can be connected to the carrier substrate 110 by other method. For example, the fingerprint sensing chip 120 is electrically connected to the carrier substrate 110 through at least one bump (not shown) by flip chip method. It is to be noted that, the mounting method of the fingerprint sensing chip 120 is not intended to limit the scope of the present invention.

The molding layer 130 covers the fingerprint sensing chip 120 and the bond wire W1 and partially covering the upper surface S1 of the carrier substrate 110. The molding layer 130 has a top surface 132a and at least one side surface 132b. The side surface 132b is located around the top surface 132a and connected to the top surface 132a. In the embodiment, the material of the molding layer 130 may be epoxy molding compound (EMC), phenolics, or silicones.

The light-pervious cover layer 140 is above the fingerprint sensing chip 120. In this embodiment, the light-pervious cover layer 140 is located on the top surface 132a of the molding layer 130. The light-pervious cover layer 140 may be glass substrate, plastic substrate or sapphire substrate. Specifically, the light-pervious cover layer 140 is a substrate being pervious to light, and the transmittance of the light-pervious cover layer 140 depends on the light transmitting property of the light-pervious cover layer 140 so that the light-pervious cover layer 140 can be transparent or translucent. The light-pervious cover layer 140 may be capable of allowing a specific light spectrum passing therethrough, for example, visible light.

The adhesive layer 160 is located between the molding layer 130 and a color layer 150. Specifically, the adhesive layer 160 is a bonding material. The light-pervious cover layer 140 attached to the color layer 150 is adhered to the top surface 132a of the molding layer 130 through the adhesive layer 160.

The fingerprint sensing unit 100 selectively comprises the color layer 150. The color layer 150 is disposed between the light-pervious cover layer 140 and the adhesive layer 160. In practice, the color layer 150 is a color paste having at least one color, such as but not limited to red, white, silver or black. Since the light-pervious cover layer 140 is pervious to light, the color of the color layer 150 under the light-pervious cover layer 140 can be appeared. Thus, the color layer 150 is used for providing the fingerprint sensing unit 100 with color, and the color of the color layer 150 can be adjusted according to practical requirements.

In this embodiment, the manufacturing method of the fingerprint sensing unit 100 can comprise the following steps. At least one fingerprint sensing chip 120 is disposed on the carrier substrate 110. The fingerprint sensing chip 120 can be electrically connected to the carrier substrate 110 by various methods, and the first embodiment is illustrated by the case of the wire bonding method. Then, the molding layer 130 covers the fingerprint sensing chip 120 and the bond wire W1 and partial upper surface S1 of the carrier substrate 110. The color layer 150 is disposed on the light-pervious cover layer 140, and then the adhesive layer 160 is disposed on the color layer 150. Next, the light-pervious cover layer 140 attached to the color layer 150 adheres to the top surface 132a of the molding layer 130 through the adhesive layer 160. It is to be noted that, a singulation process may be carried out to form individual electronic packages by laser ablating or knife cutting or other techniques. The said individual electronic package is substantially equal to the fingerprint sensing unit 100.

Figure 2A:
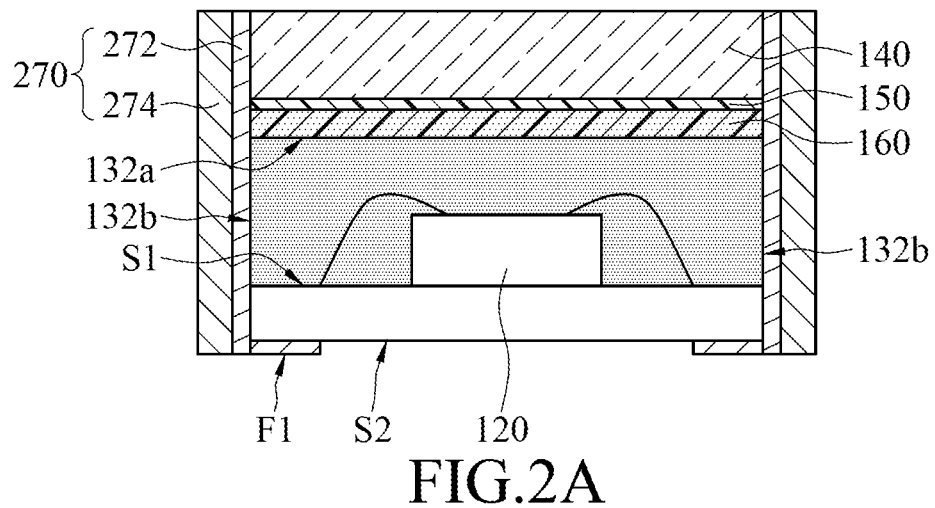
FIG. 2A is a cross-sectional view of a fingerprint sensing unit according to the second embodiment of the instant disclosure.

FIG. 2A is a cross-sectional view of a fingerprint sensing unit according to the second embodiment of the instant disclosure. The fingerprint sensing unit 200 in accordance with the second embodiment is similar to the fingerprint sensing unit 100 in accordance with the first embodiment. The fingerprint sensing unit 200 comprises an outer conductive ring member 270. The outer conductive ring member 270 surrounds the molding layer 130 and contacts the side surface 132b of the molding layer 130. The outer conductive ring member 270 is electrically connected to the fingerprint sensing chip 120 through the carrier substrate 110. Specifically, the outer conductive ring member 270 is electrically connected to the fingerprint sensing chip 120 through the layout pattern of the carrier substrate 110. In this embodiment, a gold finger pattern F1 on the lower surface S2 of the carrier substrate 110 extends to the edge of the lower surface S2 of the carrier substrate 110. Thus, the outer conductive ring member 270 covering the side surface 132b of the molding layer 130 can be electrically connected to the outer conductive ring member 270. However, in order to consider the design and the manufacture process requirement of the fingerprint sensing unit, in another embodiment, the conductive ring member 270 can be electrically connected to the metal layer (not shown) exposed from the lateral of the carrier substrate 110.

In this embodiment, the outer conductive ring member 270 may comprise an attaching layer 272 and a conductive layer 274. The attaching layer 272 can be used as a seed layer. The conductive layer 274 can be used for signal transmission. The attaching layer 272 can contact the side surface 132b of the molding layer 130 and be located between the conductive layer 274 and the molding layer 130, and the conductive layer 274 can contact the attaching layer 272. The attaching layer 272 and the conductive layer 274 made of the metal material, the alloy material, or other conductive material are formed sequentially on the side surface 132b of the molding layer 130 by sputter deposition or evaporation deposition.

It is worth mentioning that, in this embodiment, the light-pervious cover layer 140 attached to the color layer 150 is adhered to the top surface 132a of the molding layer 130 through the adhesive layer 160 and then singulation process is carried out to form a plurality of chip packaging structures (not shown). Then, the outer conductive ring member 270 is formed on said chip packaging structures. When the user's finger touches the outer conductive ring member 270 of the fingerprint sensing unit 200, the fingerprint sensing chip 120 emits a signal through the outer conductive ring member 270 to the finger of the user. The signal is changed by the fingerprint and then is reflected back to the fingerprint sensing chip 120 so that the fingerprint sensing chip 120 can identify the user's identity.

Figure 2B:
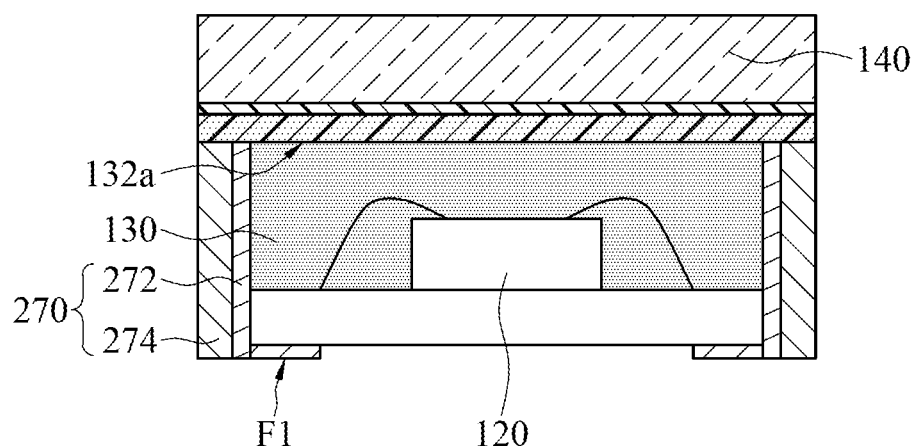
FIG. 2B is a cross-sectional view of a fingerprint sensing unit according to another embodiment of the instant disclosure.

However, to consider the design and the manufacture process requirement of the fingerprint sensing unit, in another embodiment, shown in FIG. 2B, a singulation process is carried out to form a plurality of chip packaging structures (not shown) and the outer conductive ring member 270 is formed on said chip packaging structures. Then, the light-pervious cover layer 140 attached to the color layer 150 is adhered to the top surface 132a of the molding layer 130 through the adhesive layer 160. Thus, the light-pervious cover layer 140 covers the top surface of the outer conductive ring member 270. In order to make the finger of the user can receive the signal transmitted by the outer conductive ring member 270, the fingerprint sensing unit 200 can further comprises a booster integrated circuit (not shown) to strengthen the signal from the fingerprint sensing chip 120 through the outer conductive ring member 270 and the light-pervious cover layer 140 to the finger of the user.

Figure 2C:
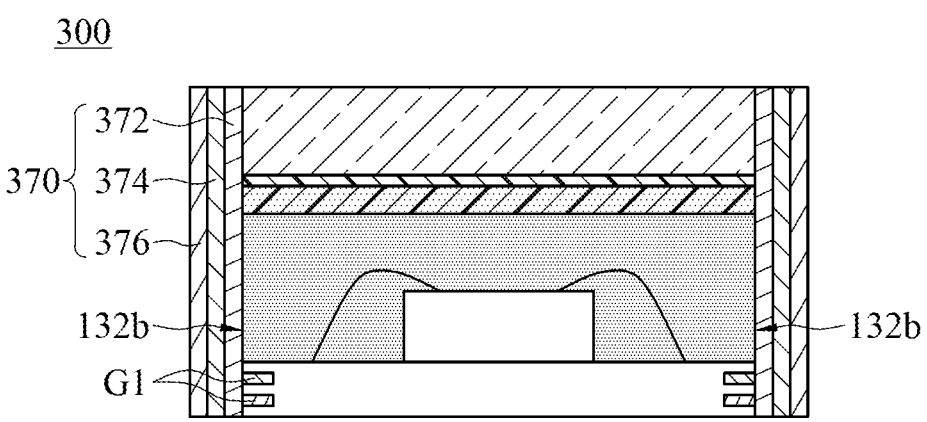
FIG. 2C is a cross-sectional view of a fingerprint sensing unit according to the third embodiment of the instant disclosure.

FIG. 2C is a cross-sectional view of a fingerprint sensing unit according to the third embodiment of the instant disclosure. In this embodiment, the outer conductive ring 370 of the fingerprint sensing device 300 further comprises an isolation layer 376 disposed the outer side of the conductive layer 374. Namely, the conductive layer 374 is located between the isolation layer 376 and the attaching layer 372. The material of the isolation layer 376 is electrically insulating material so that the isolation layer 376 prevents the signal be transmitted through the side surface of the conductive layer 374. Beside, in order to consider the design and the manufacture process requirement of the fingerprint sensing unit, the outer conductive ring member 370 can be electrically connected to the metal layer G1 exposed from the lateral of the carrier substrate 110. When the user's finger touches the outer conductive ring member 370 of the fingerprint sensing unit 300, the fingerprint sensing chip 120 emits a signal through the outer conductive ring member 370 and the metal layer G1 to the finger of the user. Thus, the fingerprint sensing chip 120 can identify the user's identity.

Figure 3A:
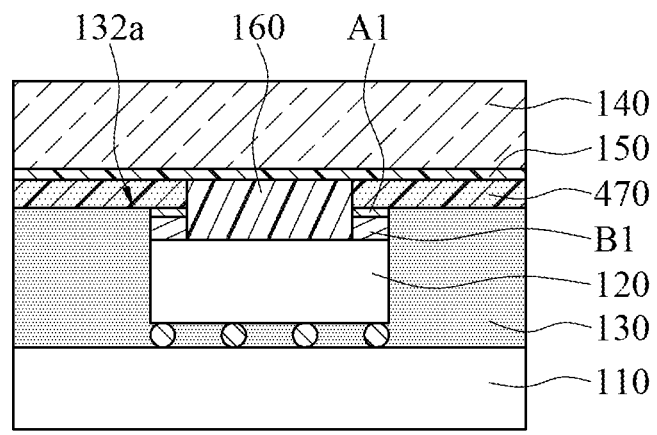
FIG. 3A is a cross-sectional view of a fingerprint sensing unit according to the fourth embodiment of the instant disclosure.

FIG. 3A is a cross-sectional view of a fingerprint sensing unit according to the fourth embodiment of the instant disclosure. In this embodiment, the fingerprint sensing chip 120 of the fingerprint sensing unit 400 is electrically connected to the carrier substrate 110 by flip chip method. However, the mounting method of the fingerprint sensing chip 120 is not intended to limit the scope of the present invention. The fingerprint sensing unit 400 further comprises at least one bump B1 disposed on the fingerprint sensing chip 120. The bump B1 is used as the electric contact to an inner conductive ring member 470. However, in another embodiment, the fingerprint sensing chip 120 may be electrically connected to the inner conductive ring member 470 through other method, such as, through anisotropic conductive film (ACF) A1. However, for the electric connection between the fingerprint sensing chip 120 and inner conductive ring member 470, the present invention is not limited to the above-described methods.

The molding layer 130 at least covers a side surface of the fingerprint sensing chip 120 and the bump B1, and the partial surface of the bump B1 is exposed through the top surface 132a of the molding layer 130.

The inner conductive ring member 470 is located between the light-pervious cover layer 140 and the molding layer 130, and the inner conductive ring member 470 is electrically connected to the fingerprint sensing chip 120. Specifically, the inner conductive ring member 470 is located under the light-pervious cover layer 140 and the color layer 150 and is electrically connected to the partial surface of the bump B1 exposed through the top surface 132a of the molding layer 130. Thus, the inner conductive ring member 470 can be electrically connected to the fingerprint sensing chip 120. Specifically, the inner conductive ring member 470 is annular and is formed by depositing the conductive materiel on the color layer 150 through the sputter process and lithography process. Furthermore, the anisotropic conductive film A1 can be coated on the partial surface of the bump B1 exposed through the top surface 132a of the molding layer 130 so that the inner conductive ring member 470 can be better electrically connected to the bump B1.

The adhesive layer 160 is located under the light-pervious cover layer 150. Specifically, the adhesive layer 160 is located on the color layer 150 and is disposed on the inner side of the inner conductive ring member 470. The adhesive layer 160 contacts the color layer 150 and the fingerprint sensing chip 120. Namely, the adhesive layer 160 fills in the space surrounded by the inner side of the inner conductive ring member 470, the color layer 150 and the fingerprint sensing chip 120. In practice, the material of the adhesive layer 160 may be an underfill material, and the light-pervious cover layer 140 attached to the color layer 150 and the inner conductive ring member 470 adheres to a top surface of the fingerprint sensing chip 120 through the adhesive layer 160. The inner conductive ring member 470 is electrically contacts the partial surface of the bump B1 exposed through the top surface 132a of the molding layer 130. It is to be noted that, the adhesive layer 160 and the molding layer 130 may be made of the same material and be formed in the same process. For example, the adhesive layer 160 and the molding layer 130 both are made of underfill material. Or, the adhesive layer 160 and the molding layer 130 may be made of different materials and be formed in different process respectively. For example, the adhesive layer 160 is made of an underfill material to fill the space surrounded by the inner side of the inner conductive ring member 470, the color layer 150 and the fingerprint sensing chip 120, and the molding layer 130 is made of epoxy molding compound to at least covers the side surface of the fingerprint sensing chip 120. When the user's finger touches the light-pervious cover layer 140 of the fingerprint sensing unit 400, the fingerprint sensing chip 120 emits a signal through the bumps B1 and the inner conductive ring member 470 and the signal pass through the light-pervious cover layer 140 to the finger of the user. Thus, the fingerprint sensing chip 120 can identify the user's identity.

Figure 3B:
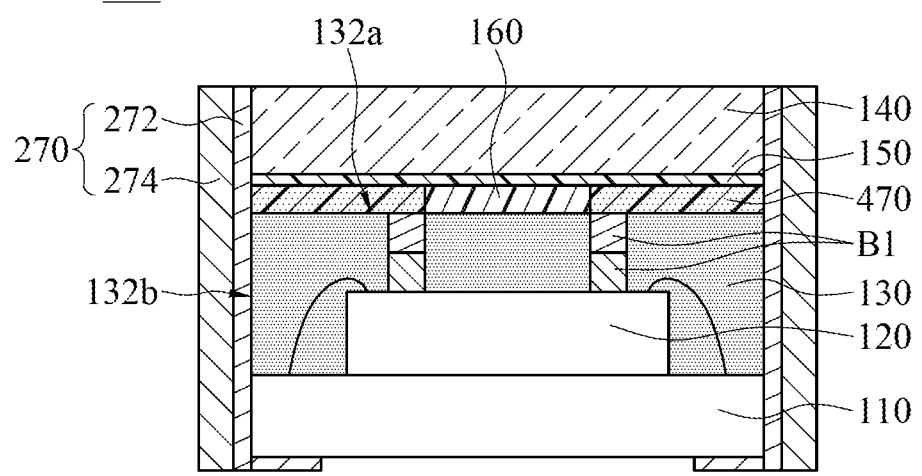
FIG. 3B is a cross-sectional view of a fingerprint sensing device according to another embodiment of the instant disclosure.

FIG. 3B is a cross-sectional view of a fingerprint sensing unit according to another embodiment of the instant disclosure. In this embodiment, the fingerprint sensing chip 120 of the fingerprint sensing unit 400 is electrically connected to the carrier substrate 110 by wire bonding method. However, the mounting method of the fingerprint sensing chip 120 is not intended to limit the scope of the present invention. Specifically, a plurality of the bumps B1 disposed on the fingerprint sensing chip 120 is used as the electric contacts to the inner conductive ring member 470. The molding layer 130 covers the fingerprint sensing chip 120 and the plurality of the bumps B1, and the partial surface of the bumps B1 are exposed through the top surface 132a of the molding layer 130. The material of the adhesive layer 160 may be an underfill material. The adhesive layer 160 is located between the light-pervious cover layer 140 and the molding layer 130. The adhesive layer 160 is disposed on the inner side of the inner conductive ring member 470 and contacts the molding layer 130. Specifically, the adhesive layer 160 fills in the space surrounded by the inner side of the inner conductive ring member 470, the color layer 150 and the molding layer 130. In practice, the adhesive layer 160 may extend to the top surface 132a of the molding layer 130. The light-pervious cover layer 140 attached to the color layer 150 and the inner conductive ring member 470 adheres to the top surface 132a of the molding layer 130 through the adhesive layer 160. The inner conductive ring member 470 electrically contacts the partial surface of the bump B1 exposed through the top surface 132a of the molding layer 130. Beside, in this embodiment, the fingerprint sensing unit 400 can further comprise the outer conductive ring member 270. The outer conductive ring member 270 surrounds the molding layer 130 and is electrically connected to the inner conductive ring member 470 exposed through the side surface 132b of the molding layer 130. The embodiments of the outer conductive ring member 270 can be the outer conductive ring member 270 of the fingerprint sensing unit 200 and the outer conductive ring member 370 of the fingerprint sensing unit 300 (shown in FIG. 2A-2C). When the user's finger touches the outer conductive ring member 270 of the fingerprint sensing unit 400, the fingerprint sensing chip 120 can emits a signal through the gold finger pattern F1 and the outer conductive ring member 270 to the finger of the user or emits a signal through the bumps B1 and the inner conductive ring member 470 to the outer conductive ring member 270. Thus, the fingerprint sensing chip 120 can identify the user's identity.

Figure 4:
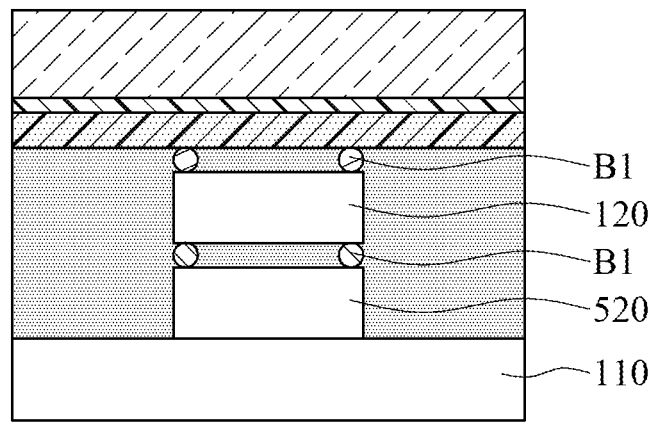
FIG. 4 is a cross-sectional view of a fingerprint sensing device according to the fifth embodiment of the instant disclosure.

FIG. 4 is a cross-sectional view of a fingerprint sensing unit according to the fifth embodiment of the instant disclosure. The difference between the fingerprint sensing unit 500 in accordance with the fifth embodiment and the fingerprint sensing unit 100 in accordance with the first embodiment is that the fingerprint sensing unit 500 further comprises an integrated circuit chip 520. In this embodiment, the integrated circuit chip 520 is disposed on the carrier substrate 110, and the fingerprint sensing chip 120 is disposed on the integrated circuit chip through at least one bump B1. In general, the integrated circuit chip 620 is a signal processing chip, which is electrically connected to the fingerprint sensing chip 120, to process the sensing signal from the fingerprint sensing chip 120.

Figure 5:
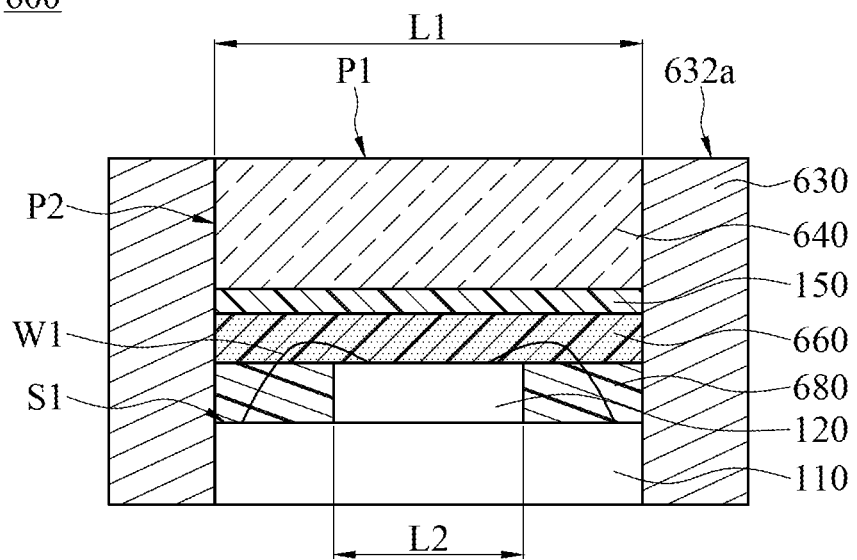
FIG. 5 is a cross-sectional view of a fingerprint sensing device according to the sixth embodiment of the instant disclosure.

FIG. 5 is a cross-sectional view of a fingerprint sensing unit according to the sixth embodiment of the instant disclosure. Please refer to FIG. 5, in this embodiment, the fingerprint sensing chip 120 of the fingerprint sensing unit 600 is disposed on the carrier substrate 110, and the color layer 150 is disposed on the light-pervious cover layer 640. The adhesive layer 660 may be a die attach film (DAF). The adhesive layer 660 is disposed on the color layer 150 and adheres to the fingerprint sensing chip 120 and covers the partial arc of the bond wire W1. The width L1 of the light-pervious cover layer 740 is larger than the width L2 of the fingerprint sensing chip 120.

The fingerprint sensing unit 600 can further comprise a filling layer 680. In practice, the filling layer 780 may be an underfill material. The filling layer 680 is disposed under the adhesive layer 600 and is located between the adhesive layer 600 and the carrier substrate 110. Specifically, the filling layer 780 fills in the space between the adhesive layer 660 and the carrier substrate 110 and surrounds the fingerprint sensing chip 120. The fingerprint sensing device 700 further comprises a molding layer 630. The molding layer 630 covers at least one side surface P2 of the light-pervious cover layer 640, partial filling layer 680 and partial carrier substrate 110. The top surface 632a of the molding layer 630 is roughly flush with a top surface P1 of the light-pervious cover layer 640. However, in another embodiment, the fingerprint sensing device 600 may merely use the filling layer 680 to protect the fingerprint sensing chip 120 without the molding layer 630 to package.

The manufacturing method of the fingerprint sensing unit 600 can comprise the following steps. At least one fingerprint sensing chip 120 is disposed on the carrier substrate 110. The fingerprint sensing chip 120 can be electrically connected to the carrier substrate 110 by various methods. The color layer 150 is disposed on the light-pervious cover layer 640, and then the adhesive layer 160 is disposed on the color layer 150. Then, the light-pervious cover layer 640 attached to the color layer 150 and the adhesive layer 660 is cut into multiple units. The light-pervious cover layer 640 of every unit adheres to the fingerprint sensing chip 120 through the adhesive layer 660. The width L1 of the light-pervious cover layer 640 is larger than the width L2 of the fingerprint sensing chip 120. Then, the filling layer 680 fills in the space under the light-pervious cover layer 640 and surrounds the fingerprint sensing chip 120. The molding layer 630 covers the side surfaces P2 of the light-pervious cover layer 640, partial filling layer 680 and partial carrier substrate 110. The top surface 632a of the molding layer 630 is roughly flush with the top surface P1 of the light-pervious cover layer 640. Then, a singulation process may be carried out to form individual electronic packages by laser ablating or knife cutting or other techniques, said individual electronic package is substantially equal to the fingerprint sensing unit 600.

Figure 6A:
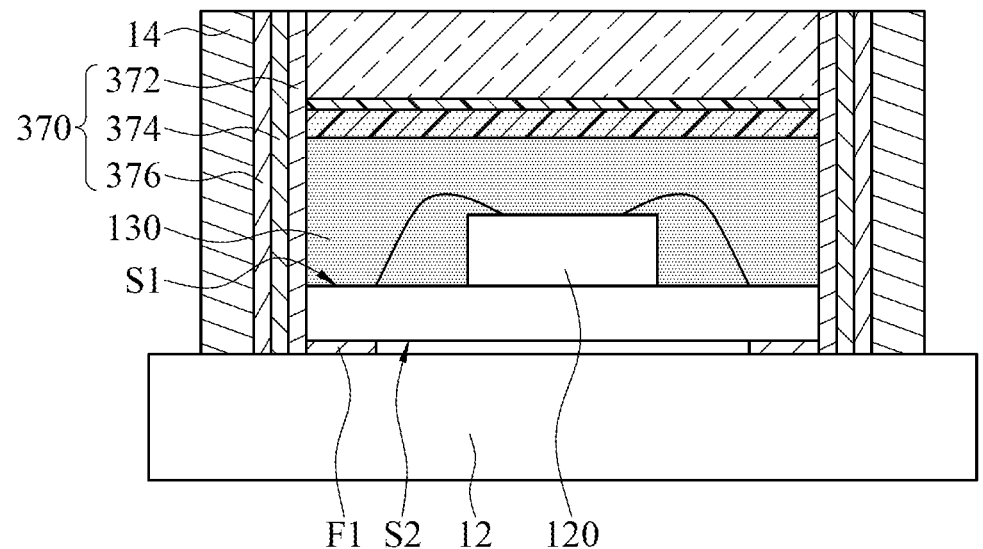
FIG. 6A is a cross-sectional view of a fingerprint sensing module according to an embodiment of the instant disclosure.

FIG. 6A is a cross-sectional view of a fingerprint sensing module according to an embodiment of the instant disclosure. The fingerprint sensing module 10 is an independent packaging module, which facilitates to be disposed on an electronic system with fingerprint recognition function. In this embodiment, the fingerprint sensing module 10 comprises the fingerprint sensing unit and a circuit board 12 electrically connected to the fingerprint sensing unit. In this embodiment, the fingerprint sensing unit is substantially equal to the fingerprint sensing unit 300 (shown in FIG. 2C)

and the circuit board 12 is electrically connected to the gold finger pattern F1 on the on the lower surface S2 of the carrier substrate 110. Beside, the fingerprint sensing module 10 can further comprise a conductive bezel 14. The conductive bezel 14 is an annular ring and surrounds the fingerprint sensing unit. Specifically, the circuit board 12 can be a printed circuit board (PCB) or a flexible printed circuit board (FPCB). The conductive bezel 14 surrounds the molding layer 130 and contacts the isolation layer 376 so that the signal from the fingerprint sensing chip 120 cannot be transmitted to the conductive bezel 14 through the side surface of the conductive layer 374. The conductive bezel 14 is electrically connected to grounding pads (not shown) of the circuit board 12 so that the conductive bezel 14 can be grounded for preventing electrostatic discharge (ESD). It is to be noted that, in another embodiment, according to the design of the fingerprint sensing module 10, the fingerprint sensing unit of the fingerprint sensing module 10 can be other embodiment of the fingerprint sensing unit of the instant disclosure.

Figure 6B:
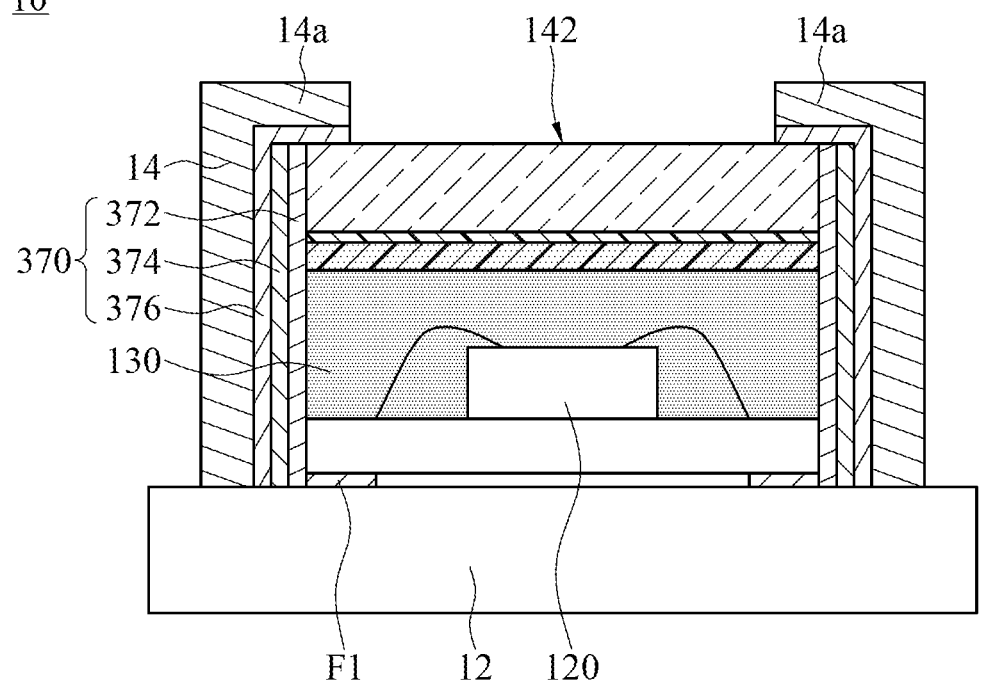
FIG. 6B is a cross-sectional view of a fingerprint sensing module according to another embodiment of the instant disclosure.

FIG. 6B is a cross-sectional view of a fingerprint sensing module according to another embodiment of the instant disclosure. In this embodiment, the conductive bezel 14 further comprises a cover frame 14a. In order to prevent the signal be transmitted to the conductive bezel 14 through the side surface of the conductive layer 374, the isolation layer 376 is disposed on the conductive layer 374 and extends towards a surface 142 of the light-pervious cover layer 140, and the cover frame 14a contacts the isolation layer 376. The cover frame 14a extends towards the central of the conductive bezel 14 and covers a part of the surface 142 of the light-pervious cover layer 140.

In summary, in the above mentioned embodiments of the fingerprint sensing unit of the present disclosure, the light-pervious cover layer can be disposed on the molding layer covering the fingerprint sensing chip through the adhesive layer or be disposed on the fingerprint sensing chip so as to form an individual fingerprint sensing module.

In addition, the fingerprint sensing unit according to one embodiment of the present disclosure comprises the outer conductive ring member which surrounds the molding layer and contacts the side surface of the molding layer. The outer conductive ring member comprises the attaching layer and the conductive layer which is formed by sputter deposition or evaporation deposition. The outer conductive ring member can be electrically connected to the fingerprint sensing chip through the gold finger pattern. According to different demand of products, the outer conductive ring member can further comprise the isolation layer. In another embodiment of the instant disclosure, the inner conductive ring member which is located on the light-pervious cover layer contacts a part of bump exposed through the top surface of the molding layer and is electrically connected to the fingerprint sensing chip. Thus, the design flexibility of the fingerprint sensing unit can be improved.

Furthermore, the fingerprint sensing module comprises the fingerprint sensing unit and a circuit board electrically connected to the fingerprint sensing unit. The circuit board is electrically connected to the gold finger pattern on the on the lower surface of the carrier substrate. The fingerprint sensing module can further comprise the conductive bezel. The conductive bezel surrounds the fingerprint sensing unit and contacts the isolation layer so that the signal from the fingerprint sensing chip cannot be transmitted to the conductive bezel through the side surface of the conductive layer. The conductive bezel is electrically connected to grounding pads of the circuit board so that the conductive bezel can be grounded for preventing electrostatic discharge. Compared to the prior art, the fingerprint sensing module of the present disclosure is an individual and modularized packaging module that is capable of easily mounting on the electronic devices, such as the smart phone, notebook and the like. Thus, in the manufacturing process for producing a electronic devices with fingerprint recognition function, several complicated fabrication steps for additionally mounting the fingerprint sensing chip on electronic device can be omitted.

While the instant disclosure has been described by way of example and in terms of the preferred embodiments, it is to be understood that the invention needs not be limited to the disclosed embodiments. For anyone skilled in the art, various modifications and improvements within the spirit of the instant disclosure are covered under the scope of the instant disclosure. The covered scope of the instant disclosure is based on the appended claims.

What is claimed is:
1. A fingerprint sensing unit, comprising:
a carrier substrate;
a fingerprint sensing chip disposed on an upper surface of the carrier substrate and electrically connected to the carrier substrate;
a molding layer, covering the fingerprint sensing chip;
a light-pervious cover layer on the molding layer;
an adhesive layer between the light-pervious cover layer and the molding layer; and
an outer conductive ring member, surrounding the molding layer and electrically connected to the fingerprint sensing chip through the carrier substrate, wherein the outer conductive ring member is electrically connected to a gold finger pattern on a lower surface of the carrier substrate or at least on metal layer exposed from the lateral of the carrier substrate.

2. The fingerprint sensing unit of claim 1, wherein the fingerprint sensing unit further comprises a color layer, and the color layer is located between the light-pervious cover layer and the adhesive layer.

3. The fingerprint sensing unit of claim 1, wherein the fingerprint sensing unit further comprises an inner conductive ring member, the inner conductive ring member is located between the light-pervious cover layer and the molding layer, and the inner conductive ring member is electrically connected to the fingerprint sensing chip.

4. A fingerprint sensing unit, comprising:
a carrier substrate;
a fingerprint sensing chip disposed on an upper surface of the carrier substrate and electrically connected to the carrier substrate;
a molding layer, covering the fingerprint sensing chip;
a light-pervious cover layer on the molding layer;
an adhesive layer between the light-pervious cover layer and the molding layer; and
an outer conductive ring member, surrounding the molding layer and electrically connected to the fingerprint sensing chip through the carrier substrate, wherein the outer conductive ring member comprises an attaching layer and a conductive layer, the attaching layer is located between the conductive layer and the molding layer, the attaching layer contacts the molding layer, and the conductive layer contacts the attaching layer.

5. The fingerprint sensing unit of claim 4, wherein the outer conductive ring member further comprises an isolation layer, and the conductive layer is located between the isolation layer and the attaching layer.

6. The fingerprint sensing unit of claim 3, wherein the fingerprint sensing unit further comprises at least one bump, the bump is disposed on the fingerprint sensing chip, and the inner conductive ring member is electrically connected to the fingerprint sensing chip through the bump.

7. The fingerprint sensing unit of claim 3, wherein the adhesive layer is located under the light-pervious cover layer, and the adhesive layer is disposed on the inner side of the inner conductive ring member and contacts the fingerprint sensing chip.

8. The fingerprint sensing unit of claim 3, wherein the adhesive layer is disposed on the inner side of the inner conductive ring member and contacts the molding layer.

9. The fingerprint sensing unit of claim 3, wherein the fingerprint sensing unit further comprises an outer conductive ring member, and the outer conductive ring member surrounds the molding layer and is electrically connected to the inner conductive ring member exposed through at least one side surface of the molding layer.

10. A fingerprint sensing module, comprising:
   a carrier substrate having an upper surface and a lower surface opposite to the upper surface;
   a fingerprint sensing chip on the upper surface and electrically connected to the carrier substrate;
   a molding layer, covering the fingerprint sensing chip;
   a light-pervious cover layer on the molding layer; and
   an adhesive layer between the light-pervious cover layer and the molding layer;
   a circuit board disposed on the lower surface and electrically connected to the carrier substrate; and
   an outer conductive ring member, electrically connected to a gold finger pattern on the lower surface of the carrier substrate.

11. The fingerprint sensing module of claim 10, wherein the circuit board is electrically connected to the gold finger pattern.

12. The fingerprint sensing module of claim 10, wherein the outer conductive ring member comprises an attaching layer, a conductive layer, and an isolation layer, the attaching layer contacts the molding layer, and the conductive layer is located between the isolation layer and the attaching layer.

13. The fingerprint sensing module of claim 12, wherein the fingerprint sensing unit further comprises a conductive bezel, the conductive bezel surrounds the molding layer and contacts the isolation layer, the conductive bezel is electrically connected to the circuit board so that the conductive bezel is grounded.

14. The fingerprint sensing module of claim 13, wherein the conductive bezel comprises a cover frame, the isolation layer is disposed on the conductive layer and extends towards a surface of the light-pervious cover layer, and the cover frame contacts the isolation layer and extends towards the central of the conductive bezel, and the cover frame covers a part of the surface of the light-pervious cover layer.

* * * * *